(12) United States Patent
Kim

(10) Patent No.: US 8,976,567 B2
(45) Date of Patent: Mar. 10, 2015

(54) SEMICONDUCTOR APPARATUS

(71) Applicant: SK Hynix Inc., Icheon-si Gyeonggi-do (KR)

(72) Inventor: Dong Keun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 2 days.

(21) Appl. No.: 13/720,706

(22) Filed: Dec. 19, 2012

(65) Prior Publication Data

US 2014/0050021 A1    Feb. 20, 2014

(30) Foreign Application Priority Data

Aug. 17, 2012  (KR) .................. 10-2012-0090134

(51) Int. Cl.
| | | |
|---|---|---|
| G11C 11/00 | (2006.01) | |
| G11C 8/00 | (2006.01) | |
| G11C 7/00 | (2006.01) | |
| G11C 13/00 | (2006.01) | |
| G11C 7/18 | (2006.01) | |

(52) U.S. Cl.
CPC .............. *G11C 7/00* (2013.01); *G11C 13/0004* (2013.01); *G11C 7/18* (2013.01); *G11C 13/0026* (2013.01); *G11C 13/004* (2013.01); *G11C 13/0069* (2013.01); *G11C 2216/22* (2013.01)
USPC ........................ 365/148; 365/163; 365/230.03

(58) Field of Classification Search
CPC ............ G11C 5/025; G11C 7/00; G11C 7/18; G11C 8/00; G11C 8/12; G11C 13/00; G11C 13/0002; G11C 13/0004

USPC .......... 365/148, 163, 185.11, 189.04, 189.19, 365/220, 230.03

See application file for complete search history.

(56) References Cited

U.S. PATENT DOCUMENTS

| | | | |
|---|---|---|---|
| 6,236,616 B1 * | 5/2001 | Kim et al. ................ | 365/230.03 |
| 7,729,158 B2 | 6/2010 | Toda et al. | |
| 7,986,551 B2 * | 7/2011 | Park et al. ..................... | 365/163 |
| 8,014,190 B2 * | 9/2011 | Lee et al. ...................... | 365/163 |
| 8,077,496 B2 * | 12/2011 | Choi ............................. | 365/148 |
| 2003/0112662 A1 * | 6/2003 | Tanzawa et al. ......... | 365/185.11 |
| 2004/0090851 A1 * | 5/2004 | Tanzawa et al. ............. | 365/200 |
| 2005/0169079 A1 * | 8/2005 | Kim ............................. | 365/207 |
| 2006/0034141 A1 * | 2/2006 | Iioka et al. ............... | 365/230.03 |
| 2006/0062072 A1 * | 3/2006 | Cho ......................... | 365/230.03 |
| 2007/0201299 A1 * | 8/2007 | Kanda et al. ............. | 365/230.06 |
| 2007/0285963 A1 * | 12/2007 | Toda et al. .................... | 365/148 |
| 2009/0122632 A1 | 5/2009 | Kwak et al. | |
| 2010/0103726 A1 * | 4/2010 | Bae et al. ...................... | 365/163 |
| 2010/0290274 A1 * | 11/2010 | Yoon et al. .................... | 365/163 |

(Continued)

FOREIGN PATENT DOCUMENTS

| | | |
|---|---|---|
| KR | 1020060023200 A | 3/2006 |
| KR | 1020090090601 A | 8/2009 |

*Primary Examiner* — Trong Phan
(74) *Attorney, Agent, or Firm* — William Park & Associates Patent Ltd.

(57) ABSTRACT

A semiconductor apparatus includes: a first bank group comprising a plurality of first banks; a second bank group comprising a plurality of second banks arranged adjacent to the first bank group; a write operation controller arranged between the first and second bank groups so as to be adjacent to the first and second bank groups, and configured to control write operations of the first and second bank groups; and a read operation controller arranged adjacent to any one of the first and second bank groups and configured to control read operations of the first and second bank groups.

6 Claims, 5 Drawing Sheets

(56) References Cited

U.S. PATENT DOCUMENTS

| | | | |
|---|---|---|---|
| 2010/0302840 A1* | 12/2010 | Yoon | 365/163 |
| 2011/0305069 A1* | 12/2011 | Kim et al. | 365/148 |
| 2013/0343116 A1* | 12/2013 | Lua et al. | 365/158 |

* cited by examiner

– 1 –

SEMICONDUCTOR APPARATUS

CROSS-REFERENCES TO RELATED APPLICATION

The present application claims priority under 35 U.S.C. §119(a) to Korean application number 10-2012-0090134, filed on Aug. 17, 2012, in the Korean Intellectual Property Office, which is incorporated herein by reference in its entirety.

BACKGROUND

1. Technical Field

The present invention generally relates to a semiconductor apparatus, and more particularly, to a semiconductor apparatus capable of performing a read-while-write operation.

2. Related Art

According to the demand for low power consumption of a semiconductor apparatus which is one of elements forming a semiconductor system, research has been conducted on next-generation memory apparatuses which are nonvolatile and do not require a refresh operation. A phase-change random access memory (PRAM) which is one of the next-generation memory apparatuses generates a phase change between amorphous and crystalline structures of a phase change layer formed of chalcogenide through Joule heating caused by a current between a top electrode and a heating electrode serving as a heater, and writes or erases data using a resistance difference occurring at this time.

FIG. 1 illustrates a bank structure of a conventional PRAM. FIG. 2 illustrates a chip structure of the conventional PRAM.

Referring to FIG. 1, a bank 100 of the conventional PRAM includes a plurality of cell mats 110, an X-decoder 120, a Y-decoder 130, a write driver (W/D) & sense amplifier (S/A) block 140, a global bit line switch (GYSW) 150, a local bit line switch (LYSW) 160, a local word line switch (LXSW) 170, and an XY control block 180 configured to control operations of the X-decoder 120 and the Y-decoder 130. FIG. 1 also illustrates bit lines BL, global bit lines GBL, and word lines WL.

Referring to FIG. 2, the bank 100 of the conventional PRAM is arranged in a core area 210, and a write/read operation controller 221 to control read and write operations of the respective banks 100 (i.e., Bank 0 to Bank 7) is arranged in a peripheral area 220.

The conventional PRAM configured in such a manner generally exhibits low data processing speed. Therefore, a read-while-write operation is required to increase the data processing speed. Accordingly, in order to enable the read-while-write operation, the conventional PRAM is configured to guarantee independent operations of two or more banks such that, when any one bank performs a read operation, another bank performs a write and verify operation.

As illustrated in FIG. 2, however, each of the banks 100 of the conventional PRAM includes the X-decoder 120, the Y-decoder 130, and the W/D & S/A block 140 so as to independently perform an operation. Therefore, according to the number of banks 100, the area of the PRAM is inevitably increased by the components included in the respective banks 100.

SUMMARY

A semiconductor apparatus capable of reducing a chip area and minimizing a write current loss even during a read-while-write operation is described herein.

In an embodiment, a semiconductor apparatus includes: a first bank group comprising a plurality of first banks; a second bank group comprising a plurality of second banks arranged adjacent to the first bank group; a write operation controller arranged between the first and second bank groups so as to be adjacent to the first and second bank groups, and configured to control write operations of the first and second bank groups; and a read operation controller arranged adjacent to any one of the first and second bank groups and configured to control read operations of the first and second bank groups.

In an embodiment, a semiconductor apparatus having a stacked structure of a plurality of banks includes: one write driver and one sense amplifier connected to the plurality of banks; and a verify sense amplifier connected to the write driver and configured to verify a write operation performed in any one bank selected among the plurality of banks.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the various embodiments will be described below with reference to the accompanying drawings through the embodiments.

Figure 1:
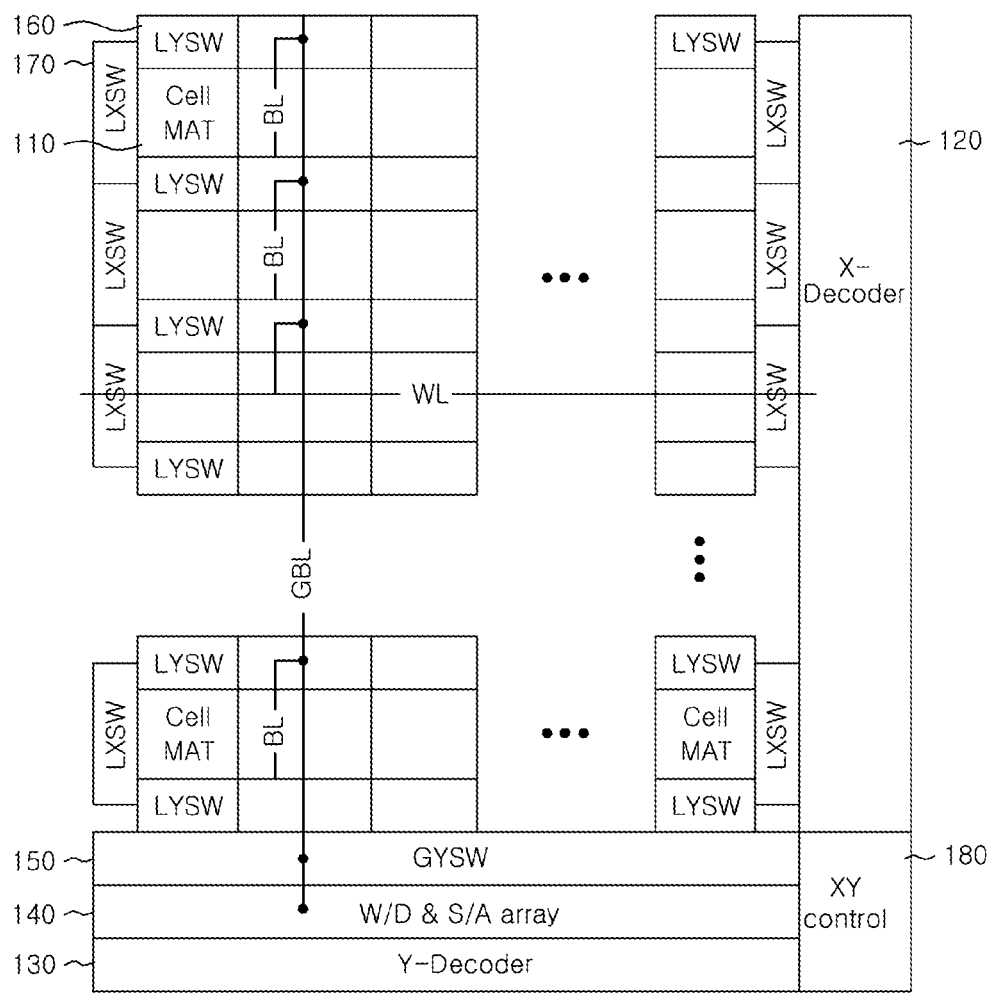
FIG. 1 illustrates a bank structure of a conventional PRAM.
Figure 2:
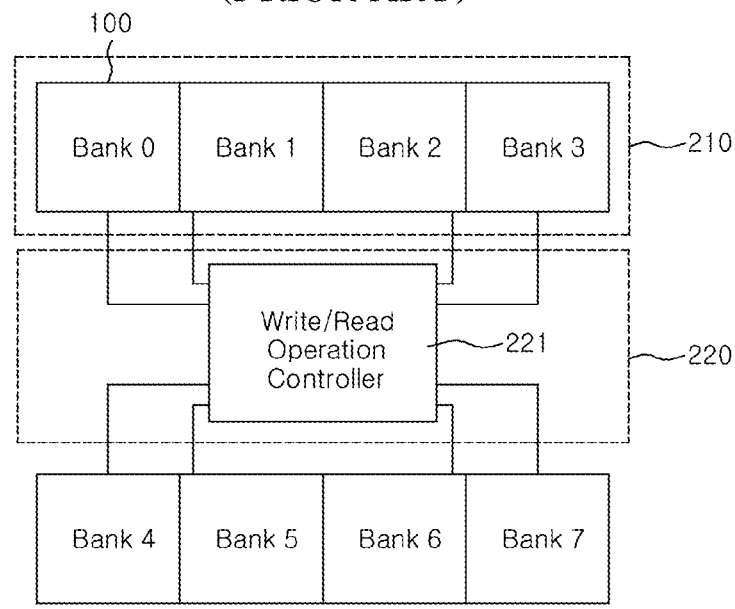
FIG. 2 illustrates a chip structure of the conventional PRAM.
Figure 3:
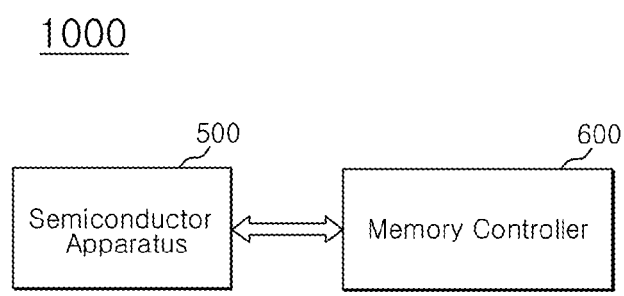
FIG. 3 illustrates the configuration of a semiconductor system according to an embodiment.

FIG. 3 illustrates the configuration of a semiconductor system according to an embodiment.

Referring to FIG. 3, the semiconductor system 1000 according to an embodiment may include a semiconductor apparatus 500 and a memory controller 600.

The semiconductor apparatus 500 may be configured to perform a data read or write operation according to a control signal outputted from the memory controller 600. The semiconductor apparatus 500 may include write global bit lines and read global bit lines which are separately arranged to enable a read-while-write operation. Such a configuration of the semiconductor apparatus 500 will be described in more detail with reference to FIG. 4.

The memory controller 600 may be configured to receive a command signal, an address signal, and a data signal from an external device, that is, a host (not illustrated) and control the operation of the semiconductor apparatus 500.

Figure 4:
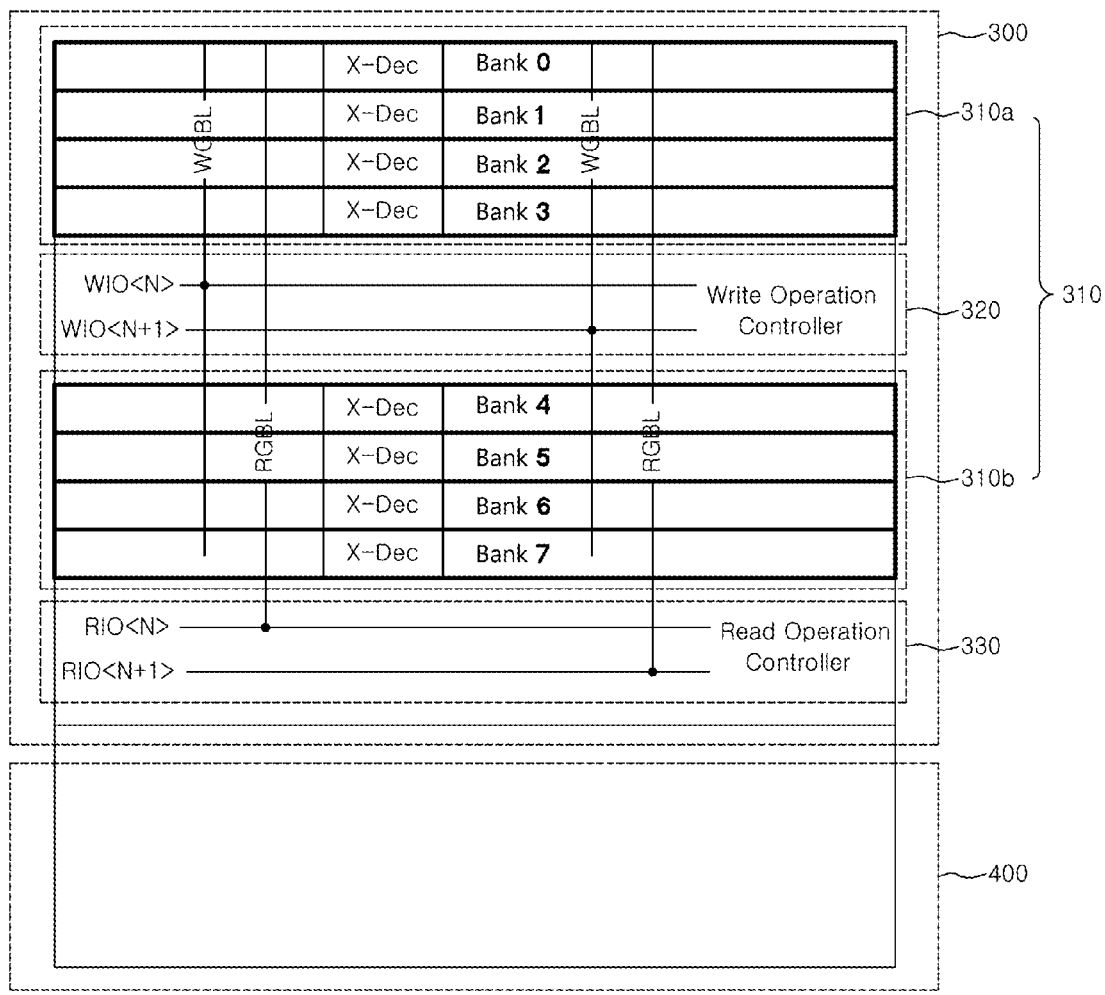
FIG. 4 illustrates a chip structure of the semiconductor apparatus according to an embodiment.
Figure 5:
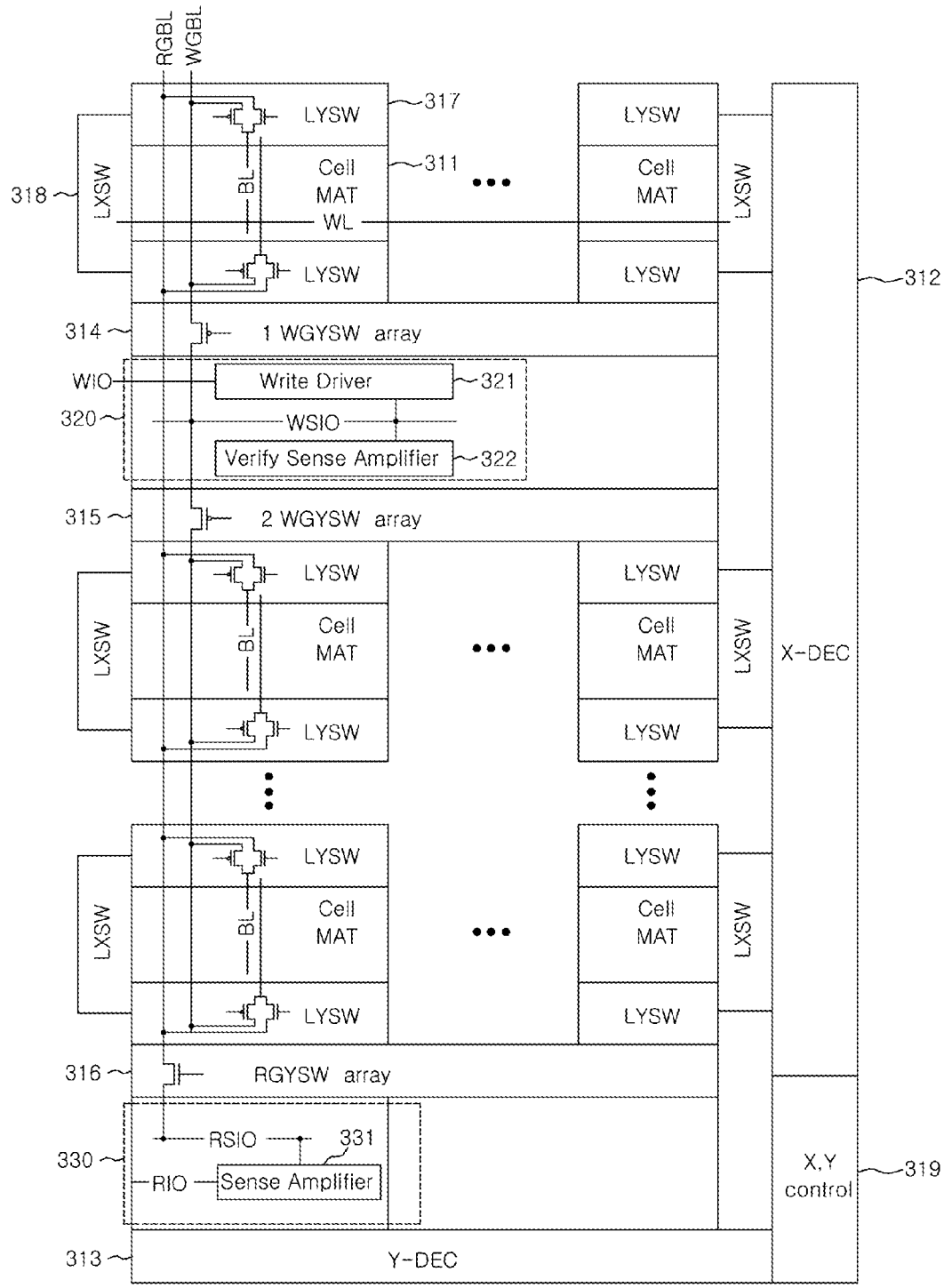
FIG. 5 illustrates a bank structure of the semiconductor apparatus according to an embodiment.

FIG. 4 illustrates a chip structure of the semiconductor apparatus according to an embodiment. FIG. 5 illustrates a bank structure of the semiconductor apparatus according to an embodiment.

Referring to FIG. 4, the semiconductor apparatus 500 according to an embodiment may be implemented as a PRAM, and has a stack bank structure. The semiconductor apparatus 500 having a stack bank structure may be divided into a core area 300 and a peripheral area 400. The semiconductor apparatus according to the embodiment may include write and read operation controllers 320 and 330 configured to control read and write operations of a plurality of banks 310 (i.e., Bank 0 to Bank 7). In an embodiment, the write and read operation controllers 320 and 330 may be arranged at different positions of the core area 300, while the write/read operation controller of the conventional PRAM may be arranged in the peripheral area.

The semiconductor apparatus 500 according to an embodiment may include write global bit lines WGBL and read global bit lines RGBL which are separately arranged in the core area 300 and connected to the plurality of stacked banks 310. Here, the reason why the write global bit lines WGBL and the read global bit lines RGBL are separately arranged is in order to support a read-while-write operation for improving the operation speed of the semiconductor apparatus. That is, in the semiconductor apparatus 500 according to an embodiment, while any one bank connected to a write global bit line WGBL is selected to perform a write operation, another bank connected to a read global bit line RGBL may be substantially simultaneously selected to perform a read operation. Since the global bit line for a write operation and the global bit line for a read operation are substantially separated from each other, develop and precharge operations may be performed. Accordingly, the entire operation speed of the semiconductor apparatus 500 is improved.

In the core area 300 of the semiconductor apparatus 500 according to an embodiment, the plurality of banks BANK0 to BANK7, the write operation controller 320 for controlling a write operation, and the read operation controller 330 for controlling a read operation may be provided.

Referring to both FIGS. 4 and 5, each of the banks BANK0 to BANK7 may include a plurality of cell mats 311 arranged in a column direction and a plurality of bit lines BL connected to the write global bit line WGBL and the read global bit line RGBL arranged in each of the cell mats 311.

The plurality of stacked banks 310 may be divided into a first bank group BANK0 to BANK3 310a and a second bank group BANK4 to BANK7 310b, based on the write operation controller 320. At this time, the plurality of stacked banks 310, that is, the first bank group 310a and the second bank group 310b commonly use the write operation controller 320 and the read operation controller 330. Referring to FIG. 5, each of the banks 310 may include a plurality of cell mats 311, an X-decoder 312, a Y-decoder 313, a first write global bit line switch (1 WGYSW array) 314, a second write global bit line switch 315 (2 WGYSW array), a read global bit line switch (RGYSW array) 316, a local bit line switch (LYSW) 317, a local word line switch (LXSW) 318, and an XY control block 319 to control operations of the X-decoder 312 and the Y-decoder 313.

Each of the cell mats 311 may include a plurality of bit lines BL and word lines WL arranged therein, and a plurality of cells to store data are arranged at the respective intersections between the bit lines BL and the word lines WL.

The X-decoder 312 may be configured to receive an address signal from outside, generate a decoding signal by decoding the received address signal, and control a word line WL in response to the generated decoding signal.

The Y-decoder 313 may be configured to output data outputted from the cell mats 311 after a read or write operation.

The first write global bit line switch 314 may be connected to the write global bit lines WGBL of the first bank groups BANK0 to BANK3 310a and configured to perform a switching operation. When data to be written into a memory cell is inputted from outside such that the write operation controller 320 supplies a current for a write operation, the first write global bit line switch 314 selects any one of the write global bit lines WGBL arranged in the first bank group 310a. The first write global bit line switch 314 may include a PMOS transistor, but is not limited thereto. The write global bit line switch 314 may include transmission gate.

The second write global bit line switch 315 may be connected to the write global bit lines WGBL of the second bank groups BANK4 to BANK7 310b and configured to perform a switching operation. When data to be written into a memory cell is inputted from outside such that the write operation controller 320 supplies a current for a write operation, the second write global bit line switch 315 selects any one of the write global bit lines WGBL arranged in the second bank group 310b. The second write global bit line switch 315 may include a PMOS transistor like the above-described first write global bit line switch 314, but is not limited thereto. The second write global bit line switch 315 may include a transmission gate. In an embodiment, the first and second write global bit line switches 314 and 315 are separately arranged, but may be configured as one write global bit line switch.

The read global bit line switch 316 may be connected to the read global bit lines RGBL of the plurality of banks BANK0 to BANK7 310, and configured to perform a switching operation. When the read operation controller 330 supplies a current for a read operation in response to an inputted read operation signal, the read global bit line switch 316 selects any one of the read global bit lines RGBL arranged in the respective banks 310. The read global bit line switch 316 may include an NMOS transistor, but is not limited thereto. The read global bit line switch 316 may include a transmission gate. Here, the reason why the write global bit line switches 314 and 315 and the read global bit line switch 316 are configured to include a PMOS transistor and an NMOS transistor, respectively, is in order to smoothly form a high voltage and a low voltage.

The local bit line switch 317 may be configured to receive data from the write global bit line WGBL or the read global bit line RGBL selected during a write or read operation, and select any one of the plurality of bit lines BL arranged in the cell mat 311.

The local bit line switch 318 may be configured to receive the decoding signal from the X-decoder 312 (i.e., X-DEC) and select any one of the plurality of word lines WL arranged in the respective cell mats 311 during a write or read operation.

The XY control block may be configured to control the operations of the X-decoder 312 and the Y-decoder 313 (i.e., Y-DEC).

As described above, the write operation controller 320 is disposed in the central portion of the plurality of banks 310, that is, between the first and second bank groups 310a and 310b. This is in order to prevent a write current loss caused by the length increase of the write global bit line WGBL. The write operation controller 320 is connected to the first and second write global bit line switches 314 and 315, and configured to control a write path to decrease. Referring to FIG. 5, the write operation controller 320 may include a write driver 321 and a verify sense amplifier 322.

The write driver 321 may be configured to receive write data through a write input/output line WIO (See also FIG. 4, i.e., WIO<N> and WIO<N+1>) from outside or generate a write driving signal in response to an output signal from the verify sense amplifier 322. The write driving signal generated in such a manner is transmitted to the write global bit line WGBL selected by the verify sense amplifier 322 and the first or second write global bit line switch 314 or 315 through a write segment input/output line WSIO.

The verify sense amplifier 322 may be configured to read data of a cell on which a write operation was performed by the write driver 321, verify whether or not the read data is identical to the written data, and provide the verification result to the write driver 321. The reason why the verify sense amplifier 322 is provided in the write operation controller 320 is in order to support a read-while-write operation for improving operation speed, because the verify sense amplifier 322 may be configured to verify a write operation.

The read operation controller 330 may be substantially arranged around the edge of the core area 300, that is, at a position adjacent to the peripheral area 400, in order to improve the output speed. The read operation controller 330 may include a sense amplifier 331. The sense amplifier 331 may be connected to the read global bit line switch 316, and configured to amplify read data outputted through the read global line RGBL selected by the read global bit line switch 316 connected to a read segment input/output line RSIO and output the amplified data to the outside.

In the semiconductor apparatus 500 according to an embodiment, the write operation controller 320 and the read operation controller 330 are positioned in the core area, while the read/write controller of the conventional PRAM are positioned in the peripheral area. Therefore, the operation path may be decreased to reduce a current loss.

Furthermore, the write operation controller 320 may include the write driver 321 and the verify sense amplifier 322 for verifying a write operation such that the plurality of stacked banks 311 commonly use the write driver 321 and the verify sense amplifier 322, and the read operation controller 330 may include the sense amplifier 331 for a read operation such that the plurality of stacked banks 311 commonly use the sense amplifier 331. Accordingly, it is possible to reduce the area which has been occupied by the write drivers and the sense amplifiers provided in the respective banks of the conventional PRAM, thereby reducing the entire chip area.

The write control path and the read control path of the semiconductor apparatus according to the embodiment will be described in detail with reference to FIGS. 6 and 7.

Figure 6:
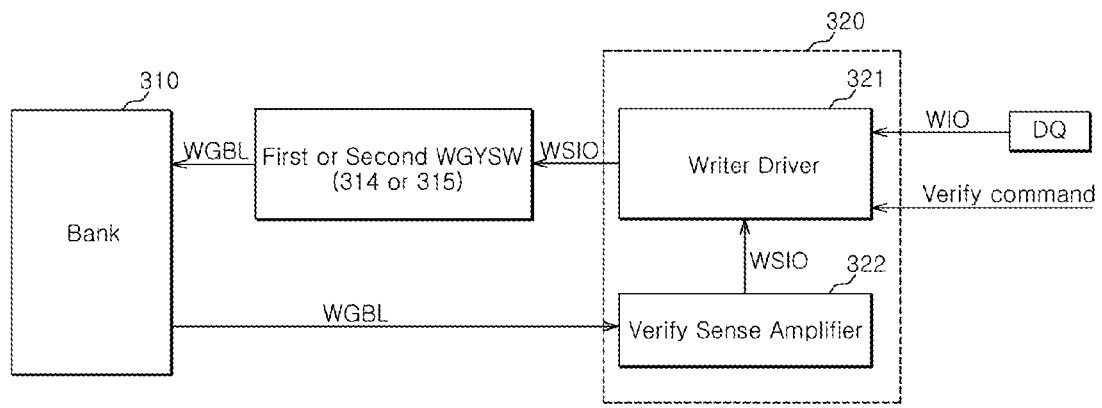
FIG. 6 illustrates a write control path of the semiconductor apparatus according to an embodiment.

FIG. 6 illustrates the write control path of the semiconductor apparatus according to an embodiment.

Referring to FIGS. 4, 5, and 6, the write control path of the semiconductor apparatus 500 according to an embodiment may be configured as follows. When write data is inputted through a data pad DQ, the data pad DQ transmits the write data to the write driver 321 of the write operation controller 320 through the write input/output line WIO.

Then, the write driver 321 may generate a write driving signal for a write operation, and may transmit the generated write driving signal to the first or second write global bit line switch 314 or 315 through the write segment input/output line WSIO.

Then, the write data may be transmitted to a selected bank 310 through any one write global bit line WGBL selected by the first or second write global bit line switch 314 or 315. At this time, when the local bit line switch LYSW 317 of the selected bank 310 and a word line WL of a selected cell are enabled, a data write operation may be performed on the selected cell.

The verification path for verifying whether or not the write operation was normally performed on the corresponding cell may be configured as follows.

When a verify command is inputted, the word line WL and the local bit line switch LYSW 317 of the corresponding cell are enabled to read the data of the corresponding cell, and the read data is then transmitted to the verify sense amplifier 322 of the write operation controller 320 through the write global bit line WGBL.

Then, the verify sense amplifier 322 may compare the read data to the written data, and may transmit the comparison result to the write driver 321 though the write segment input/output line WSIO. The write driver 321 receives the output signal from the sense amplifier 322, and controls the write operation to be performed one more time when the write operation was not normally performed.

Figure 7:
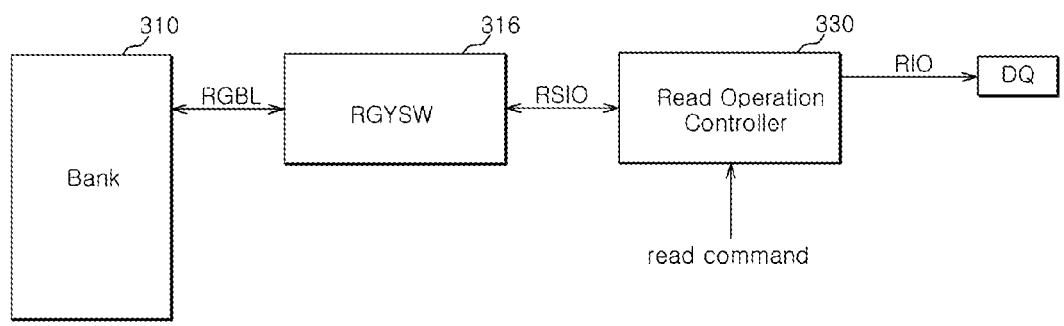
FIG. 7 illustrates a read control path of the semiconductor apparatus according to an embodiment.

FIG. 7 illustrates the read control path of the semiconductor apparatus according to an embodiment.

Referring to FIGS. 4, 5, and 7, the read control path of the semiconductor apparatus 500 according to an embodiment may be configured as follows. When a read command is inputted from outside, the read operation controller 330 including the sense amplifier 331 generates a read driving signal for performing a read operation, and the generated read driving signal is transmitted to the read global bit line switch RGYSW 316 through the read segment input/output line RSIO.

Then, the read global bit line switch RGYSW 316 transmits the read driving signal to a selected read global bit line RGBL. When the local bit line switch LYSW 317 of the corresponding bank 310 and the word line WL of the selected cell are enabled by the read global bit line RGBL, the data read operation of the selected cell is performed.

The read data may be transmitted to the read global bit line switch RGYSW 316 through the read global bit line RGBL, and the sense amplifier 331 of the read operation controller 330 connected to the read global bit line switch RGYSW 316 senses the read data, and transmits the sensed data to the data pad DQ through the read input/output line RIO (see also FIG. 5 and FIG. 4 i.e., RIO<N> and RIO<N+1>) so as to output the data to the outside.

While various embodiments have been described above, it will be understood to those skilled in the art that these embodiments described are by way of example only. Accordingly, the semiconductor apparatus described herein should not be limited based on the described embodiments.

What is claimed is:

1. A semiconductor apparatus having a core area and a peripheral area, comprising:
   a first bank group including a plurality of banks stacked with each other and arranged at the core area, wherein the plurality of banks of the first bank group are arranged in a first direction;
   a second bank group including a plurality of banks stacked with each other and arranged at the core area, wherein the plurality of banks of the second bank group are arranged in the first direction;
   a write driver and a sense amplifier connected to the plurality of banks of the first and second bank groups; and
   a verify sense amplifier connected to the write driver and configured to verify a write operation performed in any one bank selected among the plurality of banks of the first or second bank groups,
   wherein the write driver and the verify sense amplifier are arranged between the first and second bank groups, the sense amplifier are arranged between the second bank group and the peripheral area, the first and second banks include a plurality of mats, respectively and the second bank group is located between the verify sense amplifier and the sense amplifier.

2. The semiconductor apparatus according to claim 1, further comprising:
- a plurality of write global bit lines connected to one or more bit lines arranged in the plurality of banks and configured to transmit write data during a write operation; and
- a plurality of read global bit lines connected to one or more bit lines arranged in the plurality of banks and configured to transmit read data during a read operation.

3. The semiconductor apparatus according to claim 2, wherein the write driver is connected to the plurality of write global bit lines, and generates a write driving signal to transmit write data inputted from outside through any one write global bit line selected among the plurality of write global bit lines, when a write command is inputted from outside or a verification output signal is inputted from the verify sense amplifier.

4. The semiconductor apparatus according to claim 2, wherein the verify sense amplifier is connected to the plurality of write global bit lines, receives write data of a previously-performed write operation through any one write global bit line selected among the plurality of write global bit lines, verifies whether or not the received write data is input write data, and transmits a verification output signal to the write driver.

5. The semiconductor apparatus according to claim 2, wherein the sense amplifier is connected to the plurality of read global bit lines, receives read data through any one read global bit line selected among the plurality of read global bit lines when a read command is inputted from outside, amplifies the received read data, and outputs the amplified data to outside.

6. The semiconductor apparatus according to claim 2, further comprising:
- a write global bit line switch arranged among the write driver, the verify sense amplifier, and the plurality of banks, and configured to select any one of the plurality of write global bit lines connected to the plurality of banks; and
- a read global bit line switch arranged between the sense amplifier and the plurality of banks, and configured to select any one of the plurality of read global bit lines connected to the plurality of banks.

* * * * *